(12) United States Patent
Bayadi et al.

(10) Patent No.: US 11,796,598 B2
(45) Date of Patent: Oct. 24, 2023

(54) METHOD AND APPARATUS FOR DETERMINING A STATE OF CHARGE FOR A BATTERY

(71) Applicant: GENERAL ELECTRIC COMPANY, Schenectady, NY (US)

(72) Inventors: Ramaprakash Bayadi, Karnataka (IN); Karthick Gourichankar, Karnataka (IN); Sanketh Bhat, Karnataka (IN)

(73) Assignee: General Electric Company, Schenectady, NY (US)

( * ) Notice: Subject to any disclaimer, the term of this patent is extended or adjusted under 35 U.S.C. 154(b) by 178 days.

(21) Appl. No.: 17/439,910

(22) PCT Filed: Jul. 5, 2019

(86) PCT No.: PCT/US2019/040692
§ 371 (c)(1),
(2) Date: Sep. 16, 2021

(87) PCT Pub. No.: WO2021/006859
PCT Pub. Date: Jan. 14, 2021

(65) Prior Publication Data
US 2022/0179004 A1    Jun. 9, 2022

(51) Int. Cl.
*G01R 31/382*    (2019.01)
*H02J 7/00*    (2006.01)

(52) U.S. Cl.
CPC .......... *G01R 31/382* (2019.01); *H02J 7/0048* (2020.01)

(58) Field of Classification Search
None
See application file for complete search history.

(56) References Cited

U.S. PATENT DOCUMENTS

| 7,446,505 B2 | 11/2008 | Paul et al. |
| 9,797,960 B2 | 10/2017 | Barrett et al. |

(Continued)

FOREIGN PATENT DOCUMENTS

| GB | 2542212 A | 3/2017 |
| JP | H08136629 A | 5/1996 |
| JP | 2003153454 A | 5/2003 |

OTHER PUBLICATIONS

Kong Soon et al., "Enhanced coulomb counting method for estimating state-of-charge and state of-health of lithium-ion batteries", Applied Energy, vol. 86, Issue 9, pp. 1506-1511, Sep. 2009.

(Continued)

*Primary Examiner* — Jas A Sanghera
(74) *Attorney, Agent, or Firm* — Armstrong Teasdale LLP

(57) ABSTRACT

Briefly, embodiments of a system, method, and article for estimating a true state of charge (SOC) measurement for a battery based, at least in part, on a measurement of a rate of change of current supplied to the battery at a particular constant voltage value based, in part, on a current charging profile for the battery indicating a mapping between measurements of rates of change of current supplied to the battery at the particular constant voltage value and SOC measurements for the battery. A true SOC measurement for the battery may be determined based, at least in part, on the mapping. The first SOC measurement may be corrected to match the true SOC measurement at a particular point in time.

20 Claims, 6 Drawing Sheets

(56) References Cited

U.S. PATENT DOCUMENTS

| | | |
|---|---|---|
| 2009/0132186 A1 | 5/2009 | Esnard et al. |
| 2017/0168119 A1 | 6/2017 | Tagade et al. |
| 2018/0024200 A1 | 1/2018 | Hiwa |
| 2018/0120383 A1 | 5/2018 | Nishiyama |
| 2018/0203071 A1* | 7/2018 | Takemura ............. H01M 10/48 |
| 2019/0040832 A1 | 2/2019 | Namiki et al. |

OTHER PUBLICATIONS

Baccouche et al., "Implementation of an Improved Coulomb-Counting Algorithm Based on a Piecewise SOC-OCV Relationship for SOC Estimation of Li-Ion Battery", International Journal of Renewable Energy Research, Jun. 11, 2017.

International Search Report and Written Opinion dated Mar. 23, 2020 which was issue in connection with PCT/US2019/040692.

* cited by examiner

METHOD AND APPARATUS FOR DETERMINING A STATE OF CHARGE FOR A BATTERY

BACKGROUND

More and more energy systems are at least partially powered by batteries comprising one or more cells. For example, renewable power systems such as solar power may store accumulated charge in one or more batteries for subsequent use. An electric vehicle is also primarily powered by batteries. An accurate estimate of a state of charge (SOC) of one or more batteries of an energy system is of paramount importance to effectively control performance of the energy system performance and optimize battery life.

In some traditional battery systems, a Coulomb-counting method is utilized to estimate SOC of batteries such as lead acid batteries. In a Coulomb-counting method, an SOC may be estimated by integrating the active flowing current (e.g., as measured in Amps) over time to derive a total sum of energy entering or leaving a battery. An estimated SOC may be measured in Amp-hours or as a percentage of overall battery charge capacity, for example 100% for a fully charged battery.

A Coulomb-counting method, however, is often fraught with errors because of a non-linear bias in a current sensor measuring current flowing into or out of battery cells, start-stop conditions, and/or uncertainties in estimating charge efficiencies, to name just a few examples among many.

Uncorrected Coulomb-counting errors may result in an estimated SOC for a battery system which progressively drifts apart from an actual or true SOC, e.g., as a result of an accumulation of errors over time. An accumulation of Coulomb-counting errors over time may result in an estimated SOC for a battery system which differs greatly from the actual SOC of the battery system especially after the battery system has been cycled through numerous charge and discharge operations, leading to poor operational practices and eventually degradation in performance and life.

SUMMARY

According to an aspect of an example embodiment, a method may include estimating a first SOC measurement for one or more batteries based, at least in part, on a measurement of current supplied to one or more batteries and/or withdrawn from the one or more batteries during a first period of time. A rate of change of the current supplied to the one or more batteries at a particular constant voltage value may be estimated during a portion of a first charging operation. A predefined charging current profile for the one or more batteries indicating a mapping between predefined measurements of rates of change of current supplied to the one or more batteries at the particular constant voltage value and predefined SOC measurements for the one or more batteries may be accessed. An estimated SOC measurement may be determined for the one of more batteries at a particular point in time during the portion of the first charging operation based, at least in part, on the mapping of the predefined measurements of the rates of charge supplied to the one or more batteries and the predefined SOC measurements. The first SOC measurement may be corrected to match the estimated SOC measurement at the particular point in time.

According to an aspect of another example embodiment, a system may include a memory to store a predefined SOC profile for one or more batteries indicating a mapping between predefined measurements of rates of change of current supplied to the one or more batteries at the particular constant voltage value and predefined SOC measurements for the one or more batteries. The system may also include a processor to estimate a first SOC measurement for the one or more batteries based, at least in part, on a measurement of current supplied to one or more batteries and/or withdrawn from the one or more batteries during a first period of time. The processor may estimate a rate of change of the current supplied to the one or more batteries at a particular constant voltage value during a portion of a first charging operation during the first period of time. The processor may additionally determine an estimated SOC measurement for the one of more batteries at a particular point in time during the portion of the first charging operation based, at least in part, on the mapping of the predefined measurements of the rates of charge supplied to the one or more batteries and the predefined SOC measurements. The processor may also correct the first SOC measurement to match the estimated SOC measurement at the particular point in time.

According to an aspect of another example embodiment, an article may comprise a non-transitory storage medium comprising machine-readable instructions executable by one or more processors to perform one or more operations. For example, the one or more processors may estimate a first SOC measurement for one or more batteries based, at least in part, on a measurement of current supplied to one or more batteries and/or withdrawn from the one or more batteries during a first period of time. The one or more processors may also estimate a rate of change of the current supplied to the one or more batteries at a particular constant voltage value during a portion of a first charging operation during the first period of time. The one or more processors may additionally access a predefined current charging profile for the one or more batteries indicating a mapping between predefined measurements of rates of change of current supplied to the one or more batteries at the particular constant voltage value and predefined SOC measurements for the one or more batteries. The one or more processors may further determine an estimated SOC measurement for the one of more batteries at a particular point in time during the portion of the first charging operation based, at least in part, on the mapping of the predefined measurements of the rates of charge supplied to the one or more batteries and the predefined SOC measurements. The one or more processors may also correct the first SOC measurement to match the estimated SOC measurement at the particular point in time.

Other features and aspects may be apparent from the following detailed description taken in conjunction with the drawings and the claims.

BRIEF DESCRIPTION OF THE DRAWINGS

Features and advantages of the example embodiments, and the manner in which the same are accomplished, will become more readily apparent with reference to the following detailed description taken in conjunction with the accompanying drawings.

Figure 1A:
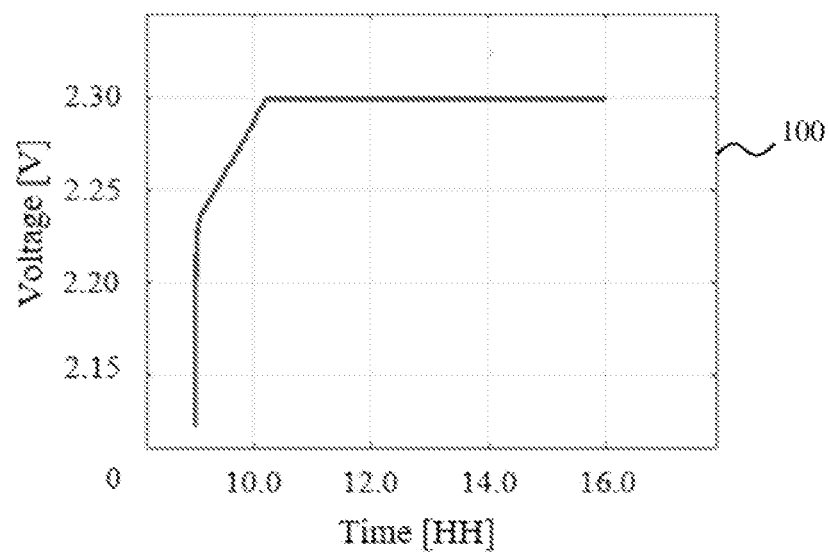
FIGS. 1A and 1B illustrate charts of voltage and current profiles, respectively, during a charging phased for a battery according to an embodiment.

Throughout the drawings and the detailed description, unless otherwise described, the same drawing reference numerals will be understood to refer to the same elements, features, and structures. The relative size and depiction of these elements may be exaggerated or adjusted for clarity, illustration, and/or convenience.

DETAILED DESCRIPTION

In the following description, specific details are set forth in order to provide a thorough understanding of the various example embodiments. It should be appreciated that various modifications to the embodiments will be readily apparent to those skilled in the art, and the generic principles defined herein may be applied to other embodiments and applications without departing from the spirit and scope of the disclosure. Moreover, in the following description, numerous details are set forth for the purpose of explanation. However, one of ordinary skill in the art should understand that embodiments may be practiced without the use of these specific details. In other instances, well-known structures and processes are not shown or described in order not to obscure the description with unnecessary detail. Thus, the present disclosure is not intended to be limited to the embodiments shown but is to be accorded the widest scope consistent with the principles and features disclosed herein.

One or more example embodiments as discussed herein is directed to a method, system, and/or apparatus for determining a State of Charge (SOC) for a battery comprising one or more cells. For example, an SOC may be estimated via a method such as Coulomb-counting, open-circuit voltage measurement, and/or equivalent circuit modeling, to name just a few examples. For example, a Coulomb-counting method or process may be utilized to estimate an SOC for a battery throughout much of a charge cycle of the battery. A life of a battery may be expressed in terms of time, such as a number of months of the battery's age, or as a number of cycles. The number of cycles for which a battery may last depends on operating conditions of the battery, for example. A "charge cycle" or "battery cycle," as used herein, refers to a process of charging one or more rechargeable batteries and discharging stored charge into a load. Cycling of batteries through various charge cycles may degrade a battery over time and adversely affect the battery's lifespan, for example. Discharging a battery fully or down to a relatively low SOC before recharging may be referred to as "deep discharge," whereas partially discharging (e.g., to values of 70-80% SOC) the battery may be referred to as a "shallow discharge."

Knowing an accurate estimate of an SOC of a battery may be of critical importance to overall performance of an electrical system utilizing the battery. For example, if a battery has a relatively low estimated SOC, an electrical system may enter a power-saving mode to preserve battery charge as long as possible while still providing electric power or charge to power critical system operations. However, if an estimate of an SOC is inaccurate, the electrical system may enter a power savings mode when the actual SOC is larger than the estimate of the SOC, thereby degrading operation of the electrical system. Similarly, if the estimate of the SOC is higher than the actual SOC of the battery, non-critical functions may continue to be performed while the battery has a relatively low actual SOC, thereby potentially unnecessarily draining remaining battery charge, which may result in the battery becoming fully discharged at an inconvenient moment and increasing the rate of degradation of the battery.

A Coulomb-counting method may maintain an ongoing measurement of charge of a battery during charging, discharging, and while a battery remains idle, where the battery is neither charging nor discharging. A Coulomb-counting method may provide a fairly accurate estimate of an SOC for a battery during a shallow discharge with a relatively stable or constant load. For example, if the amount of electric power supplied by a battery during a discharge is relatively constant, a Coulomb-counting method may determine a relatively accurate estimate of an SOC of the battery. However, if the amount of electric power supplied by the battery during a discharge varies, a Coulomb-counting method may be inaccurate. For example, if a battery provides electric power to an electrical vehicle, the amount of electric power supplied by the battery may vary substantially between initial powering up of the electric vehicle, acceleration of the electric vehicle during a driving operation, and/or by a user turning on or off certain devices such as the air conditioning or heater in the electric vehicle. Similarly, if a battery provides electric power to a power grid, if 15 houses simultaneously turn on air conditioners, a load drawing the electric power may increase substantially within a relatively short period of time, for example.

A drawback of a Coulomb-counting method is the potential for accumulation of errors over time. Errors may be introduced in various ways. For example, a sensor measuring current may be prone to errors, such as where the load drawn is too high for the sensor to obtain reliable measurements. Moreover, errors may occur at any time during a charge/discharge cycle of a battery. Even if an amount of particular error is relatively small, an aggregative effect due to accumulation of errors over time may result in relatively large errors in an estimate of an SOC of a battery. For example, if a 2% error is introduced in one cycle of a battery, such that an estimate of an SOC is only 98% of the actual SOC of the battery, after numerous cycles of the battery, the estimate of the SOC may differ by a relatively large factor from the actual SOC of the battery. For example, after 15 cycles, the accumulation of errors may result in an estimate of an SOC which is potentially about 30% below the actual SOC of the battery. Moreover, although in this example an error results in an estimated SOC which is lower than the actual SOC of the battery, it should be appreciated that the introduction of some errors may result in an estimate of an SOC which is larger than the actual SOC, for example.

An embodiment as discussed herein may determine an SOC estimate which is more accurate than may be possible via a Coulomb-counting method or process. For example, in accordance with an embodiment, a Coulomb-counting method may be utilized to estimate an SOC for a battery while the battery is discharging and while the battery is charging up to a certain predefined threshold SOC level, which may be within a range of approximately 60-70% of the SOC capacity of the battery. It should be appreciated that this estimate 60-70% of the SOC capacity is one particular example of a threshold SOC level for estimating an SOC of a battery during charging and other threshold values may be utilized in some embodiments. For example, a threshold value of the SOC capacity for a battery may be based, at least in part, on a particular chemistry of the battery. For example, a battery utilizing a lithium ion chemistry may be associated with a different threshold value of SOC capacity than may a lead acid battery.

For example, various profiles of charging characteristics may be predefined or otherwise known for different battery chemistries. For example, if a battery is charging at a constant voltage, the battery may exhibit certain characteristics. For example, if the battery is charging at a constant voltage, the amount of current flowing into the battery to charge the battery may decrease at a particular rate, as discussed in more detail with respect to FIGS. 1A-B and 2A-B below. If the value of the constant voltage level is known and the rate of charging current flowing to the battery to perform the charging is measured, the value of the rate of change of the charging current measurement may be utilized to determine an actual or true SOC for the battery. For example, there may be a predefined current charging profile for a particular battery which shows a relationship such as a mapping between the value of the rate of change of the charging current and the actual or true SOC for the battery. A "true" SOC, as used herein, refers to an SOC value which indicates a reliable and/or accurate measurement of SOC for a battery. For example, a true SOC may comprise an SOC estimate which represents an actual SOC of a battery, such as an SOC which has not been adversely affected by accumulation of errors.

In one particular embodiment, the current charging profile may be stored as a plot of points on a graph and/or as a lookup table such that if the value of the current is measured, a value of a true SOC for the battery may be determined. The value of the true SOC may be compared against an estimate of SOC for the battery as determined during an ongoing Coulomb-counting method, for example. If errors have been incurred or otherwise encountered during the Coulomb-counting method, for example, the SOC estimate may differ, potentially substantially, from the actual SOC of the battery. However, a mapping of a rate of change of a charging current relative to a true SOC for the battery may be relatively accurate.

Coulomb counting in a given cycle may be accurate to about 5% in one particular implementation, but accumulation of errors presents a problem, because coulomb counting relies on historical measurements, unless a method is introduced to periodically correct/calibrate the SOC. One or more embodiments as discussed herein are directed to correcting the SOC, such as during every charge cycle while charging occurs at constant voltage, for example. Such a method may ensure that a measurement error in a conventional coulomb-counting method is corrected and hence the error does not perpetuate and may therefore be contained.

Predefined current charging profiles utilized to determine a true SOC for a battery in accordance with an embodiment may be accurate for implementations where a battery is being charged at a particular constant voltage value. In one particular implementation, a limiting charge voltage recommended for certain types of batteries, such as lead-acid batteries, may be utilized as the constant charging voltage. However, it should be appreciated that constant voltage charging may be forced at a different voltage level but with a caveat, for example, that if the charging is performed at too low of a voltage level, the rate of change of current may be relatively slow and therefore less useful for identifying a particular SOC. In accordance with an embodiment, there may be a range of voltages at the higher end of the cell SOC (such as, e.g., approximately 2.30-2.35 V for a lead-acid cell) where the rate of charge of current with SOC has a higher resolution and a more distinct signature.

In another embodiment a profile for a constant voltage discharge may be utilized to indicate an SOC for a battery during a constant voltage discharge operation at a relatively low SOC, such as at an SOC below a threshold value of approximately 20%, such as within a range of SOC of approximately 0-20%, for example. In other words, at a relatively low SOC value a discharge current at constant voltage discharge may exhibit a particular relationship between a rate of change of the discharge current and the SOC of the battery such that if the rate of change of the discharge current is measured, it may be utilized to determine a corresponding SOC for the battery, such as via reference to a lookup table of values, for example. In such an embodiment, the SOC determined based on the rate of charge of discharge current may be utilized to replace a value of SOC determined via a coulomb-counting method, for example.

A rate of change of charging current during a constant voltage charge operation and a rate of change of discharge current during a constant voltage discharge operation may both be utilized to estimate an SOC for a battery, for example, because of properties of a resistance profile across the SOC for the battery. For example, during a charging operation, such a resistance profile may not exhibit much change until it reaches a relatively high SOC where the charge voltage is at a constant voltage value, after which there may be a sharp change in resistance. Similarly, while discharging at a relatively lower value of the SOC, the discharge resistance may experience a relatively sharp increase.

A determination of a true SOC for a battery may be utilized to update an SOC estimate for the battery or to determine a correction factor for a Coulomb-counting method, for example. For example, during a charging process, a charging voltage may only remain at a constant value during a certain portion, such as where the actual SOC of the battery is above a 60-70% threshold, as discussed above. While the battery is discharging or is charging at a charging voltage that is dynamic or changing (e.g., non-constant), a Coulomb-counting method may be utilized to estimate an SOC of the battery. However, when a constant voltage is reached during the charging process, the true SOC may be determined and may be utilized to replace the SOC estimate determined via the Coulomb-counting method. In other words, an ongoing Coulomb-counting method may effectively be reset by replacing a potentially inaccurate SOC estimate with a relatively more accurate true SOC value and subsequently continuing the Coulomb-counting method. For example, such a process may provide an opportunity in every charge/discharge cycle of a battery to correct for an SOC estimate determined via a Coulomb-counting method and may therefore reduce an SOC drift (or error propagation and aggregation) which may be introduced by the Coulomb-counting method.

Such an implementation may provide various benefits, such as improved control of assets including batteries and battery life optimization, for example. Moreover, a levelized cost of energy (LCOE) provided by a power system may be optimized or otherwise improved, for example. LCOE is a measure of a power source which allows comparisons of different methods of electricity generation on a consistent basis. LCOE may provide an economic assessment of the average total cost to build and operate a power-generating asset over its lifetime divided by the total energy output of the asset over that lifetime. An LCOE may also be regarded as the average minimum price at which electricity must be sold in order to break-even over the lifetime of the project.

Figure 1B:
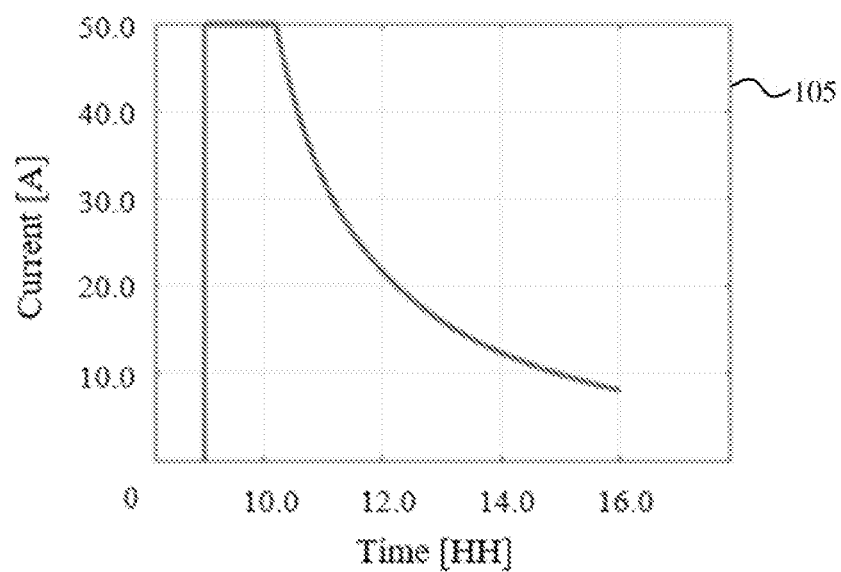

In accordance with an embodiment, during a charging phase of a battery, a battery may be charged with electric power at an initial current level until an estimated SOC reaches a particular threshold value. FIGS. 1A and 1B illustrate embodiments 100 and 105 of charts of voltage and current profiles, respectively, during a charging phase for a battery according to an embodiment. Embodiments 100 and 105 illustrate charts which show that a charging operation for a battery is initiated at around 5.0 hours and continues until around 16.0 hours. During the charging operation, values of the charging voltage and charging current supplied to the battery being charged are shown in the charts of embodiments 100 and 105. For example, as illustrated in the chart of embodiment 100, when charging is initiated, the charging voltage supplied during the charging operation is between 2.20 and 2.25 Volts and increases approximately linearly until the voltage reaches a value of approximately 2.30 Volts at approximately 10.25 hours. As time elapses between 10.25 hours and 16.0 hours, the charging voltage applied to the battery is maintained at a constant value of 2.30 Volts.

During the charging operation, a charging current supplied to a battery is initially approximately 50.0 Amps and remains approximately constant at about 50.0 Amps until the time elapsed reaches approximately 10.25 hours, as shown in the chart of embodiment 105. As the charging process continues between 10.25 hours through 16.0 hours, the value of the charging current supplied to the battery continues to decrease from 50.0 Amps to approximately 9.0 Amps at 16.0 hours as is illustrated in the chart of embodiment 105. As shown, the value of the charging current supplied to the battery during the charging operation may decrease at a somewhat exponential rate, although the rate of change of the charging current supplied to the battery may decrease by a different rate in certain embodiments, for example.

As shown in charts of embodiments 100 and 105 of FIGS. 1A and 1B, respectively, during a typical recharging process a charging current supplied is initially approximately constant while a charging voltage supplied increases. However, once the charging voltage supplied reaches a particular threshold value, the amount of charging current supplied begins to decrease, such as at 10.25 hours as is illustrated.

The charging voltage and charging current profiles shown in charts of embodiments 100 and 105 may remain approximately constant for batteries of the same chemistry, for example. In other words, two different lead acid batteries, for example may be associated with similar charging voltage and charging current profiles. Similarly, two different lithium ion batteries, for example may be associated with similar charging voltage and charging current profiles. It should be appreciated that teachings may also be applicable to certain batteries chemistries other than lead acid or lithium ion, for example. Information shown in these profiles of charts of embodiments 100 and 105 may be utilized in accordance with an embodiment as discussed herein to approximate an SOC of a battery. For example, if the rate of change of the charging current as exhibited in the charging current profile of chart 105 is estimated, the estimated rate of change of the charging current may be utilized to determine an approximate actual or true SOC for the battery. An "actual" or "true" SOC, as used herein, refers to a value of an SOC determined from a predefined charging current profile or mapping of a rate of change of current to SOC for a battery during a portion of a charging cycle. For example, as shown in the chart of embodiment 105, a rate of change of the charging current may continually change during an exponential-like portion of the charging current profile while the voltage is held at an approximately constant value between about 10.25 hours and 16.0 hours. For example, a reason why the rate of charging current changes while the voltage remains at a constant charging voltage value during a charging process is because a cell or charge resistance may increase fairly significantly with SOC during these constant-voltage charging phases, which may typically happen at a higher end of the SOC scale, such as above 70% of the SOC.

Figure 2A:
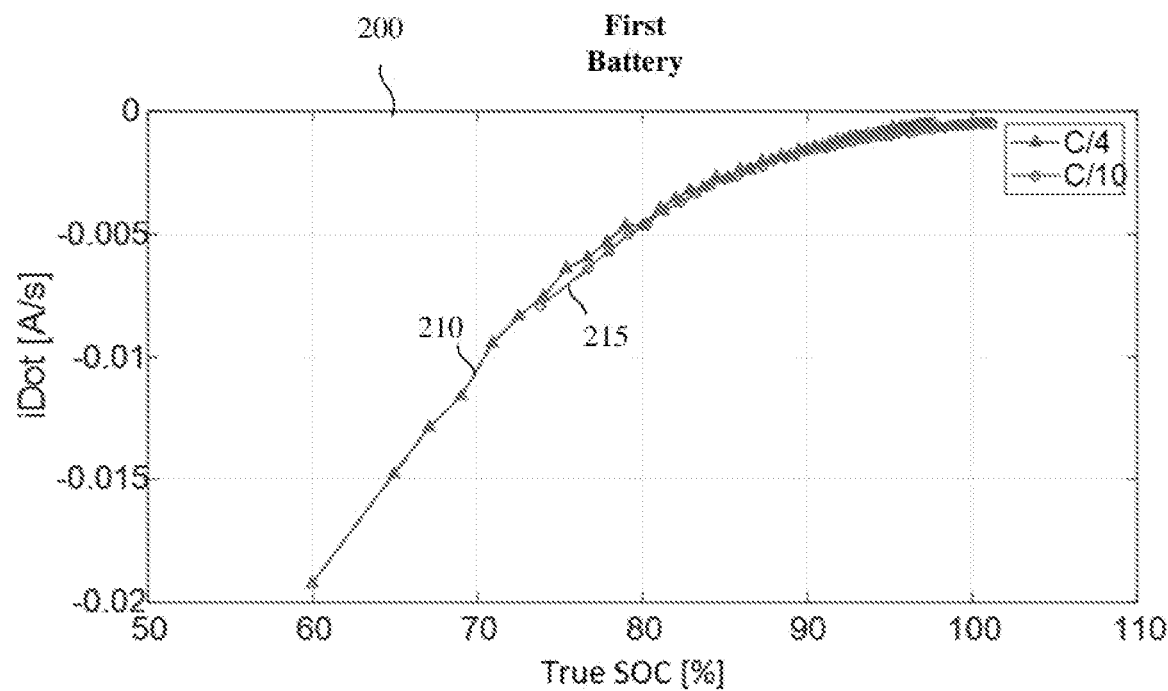
FIGS. 2A and 2B illustrate charts showing plots of rate of change of current supplied to first and second batteries, respectively, during a charging operation relative to an SOC of the corresponding battery according to an embodiment.
Figure 2B:
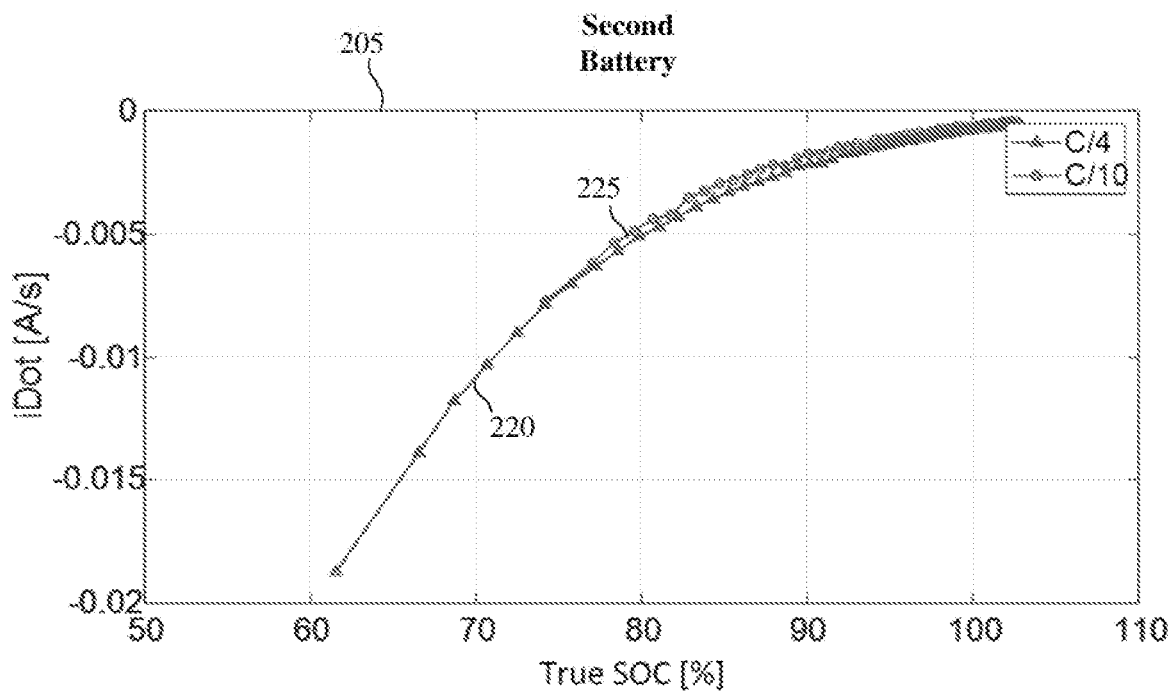

A charging current profile may be determined for a type of battery, such as a lithium ion or lead acid battery, to name just two types of batteries among many. The charging current profile may indicate a relationship between the true SOC of the battery and a rate of change of the charging current flowing into a battery during a charging operation. For example, the slope of the plot of the charging current as shown in FIG. 1B where the plot exhibits an exponential-type of shape may have a slope which continually changes while at constant voltage until the charging operation ends. In an embodiment as shown in FIG. 1B, the slope or rate of change of the charging current may continually decrease between a time at which a battery initially provides charging current at constant voltage as the battery is charged until the charging operation ends. A value of the rate of change of the charging current supplied during the charging operation may be utilized to determine a true SOC for the battery. In one particular implementation, a plot of a rate of change of a charging current relative to a true SOC may be utilized to determine a true SOC for a battery where the rate of change of charging current is known or otherwise estimated. For example, a relationship between rate of change of the charging current and the true SOC may be represented in a chart or plot, such as is shown in FIGS. 2A and 2B as discussed below. For example, this relationship may be determined by testing the battery for a particular duty cycle or estimating the relationship based on test measurements from similar batteries for the particular duty cycle, such as performed by a manufacturer of the batteries. This relationship may also, or alternatively, be represented in a lookup table, for example.

FIGS. 2A and 2B illustrate charts 200 and 205 showing plots of rate of change of charging current supplied to first and second batteries, respectively, during a charging operation relative to a true SOC of the corresponding battery according to an embodiment.

Chart 200 illustrates a charging current profile for a first battery between a true SOC of 60% and slightly over 100%. The true SOC may exceed 100% where the first battery is overcharged, for example. A rate of change of charging current is denoted as "iDot" in terms of Amperes per second, or A/s, as shown in FIGS. 2A and 2B, for example. As shown, the rate of change of the charging current during a charging operation may be within a range between about −0.02 A/s and 0 A/s in chart 200. Chart 200 illustrates plots of true SOC versus iDot for a charging operation performed at two differ magnitudes of current charging—e.g., a relatively high current for a fast charging operation and a relatively low current for a slow charging operation. For example, a fast charging current is denoted as C/4 in chart 200 and may comprise a charging current of approximately 100 Amps for a 400-Ah battery. A slow charging current is denoted as C/10 in chart 200 and may comprise a charging current of approximately 40 Amps for a 400-Ah battery, for example. Absolute values of charging currents for fast and slow charging currents may differ based on the particular application and battery chemistry. Values of 100 Amps and 40 Amps are shown for the sake of simplicity.

Chart 200 for the first battery shows two current charging profiles—a first current charging profile 210 for a battery chagrining at the fast charging current, C/4, and a second current charging profile 215 for the battery charging at the slow charging current, C/10. The first and second current charging profiles 210 and 215, respectively, are similar for a charging current having an iDot between about −0.0075 and 0.0 A/s and a true SOC between about 75% and about 100%. Accordingly, if the rate of change current of a battery being charged at constant voltage is between about −0.0075 and 0.0 A/s, a true SOC may be determined for a battery based on reference to chart 200, regardless of whether the battery is subjected to a fast charging current or a slow charging current.

Chart 205 as shown in FIG. 2B also illustrates two charging current profiles—a first current charging profile 220 for a battery chagrining at the fast charging current, C/4, and a second current charging profile 225 for the battery charging at the slow charging current, C/10. The first and second charging profiles 220 and 225, respectively, are similar for a current having an iDot between about −0.0075 and 0.0 A/s and a true SOC between about 75% and about 100%. Accordingly, if the rate of change of current of a battery being charged at constant voltage is between about −0.0075 and 0.0 A/s, a true SOC may be determined for a battery based on reference to chart 205, regardless of whether the battery is subjected to a fast charging current or a slow charging current.

As illustrated, the profiles shown in chart 205 are similar to those shown in chart 200. Accordingly, it should be appreciated that charts of iDot vs true SOC are similar across different batteries of the same battery chemistry and same age or State of Health (SOH), for example. A "State of Health" or "SOH," as used herein, refers to a condition of a battery, cell, or plurality of batteries, relative to a baseline comparison. Units of SOH of a battery may be expressed in terms of percentage points, such as where a SOH of 100% indicates that the battery's health matches the battery's baseline or initial health, for example. A battery's SOH may initially be 100% of the baseline conditions during a first charge cycle and may decrease over time and use, for example.

The profiles shown charts 200 and 205 indicate rate of plots of rate of change of charging current supplied to first and second batteries, respectively, during a charging operation relative to a true SOC of the corresponding battery at a particular ambient temperature. Such charts may be sensitive to an ambient temperature at which a charging operation is performed. It should be appreciated that the plots may differ if determined for a different ambient temperature, for example. For example, if charging at a relatively warm ambient temperature, such as 100° F., a chart may have a different slope than if charging at a lower ambient temperature, such as 70° F. Similarly, a profile for a battery may differ based on an SOH of the battery. For example, a battery with a higher SOH, such as a relatively new and/or lightly used battery, may be associated with a different plot than would a battery with a lower SOH, such as a relatively old and/or heavily used battery. In accordance with one or more embodiments, an SOC of a battery may be determined based on a particular constant voltage charge protocol at a particular temperature range and SOH range of the battery, for example.

Figure 3:
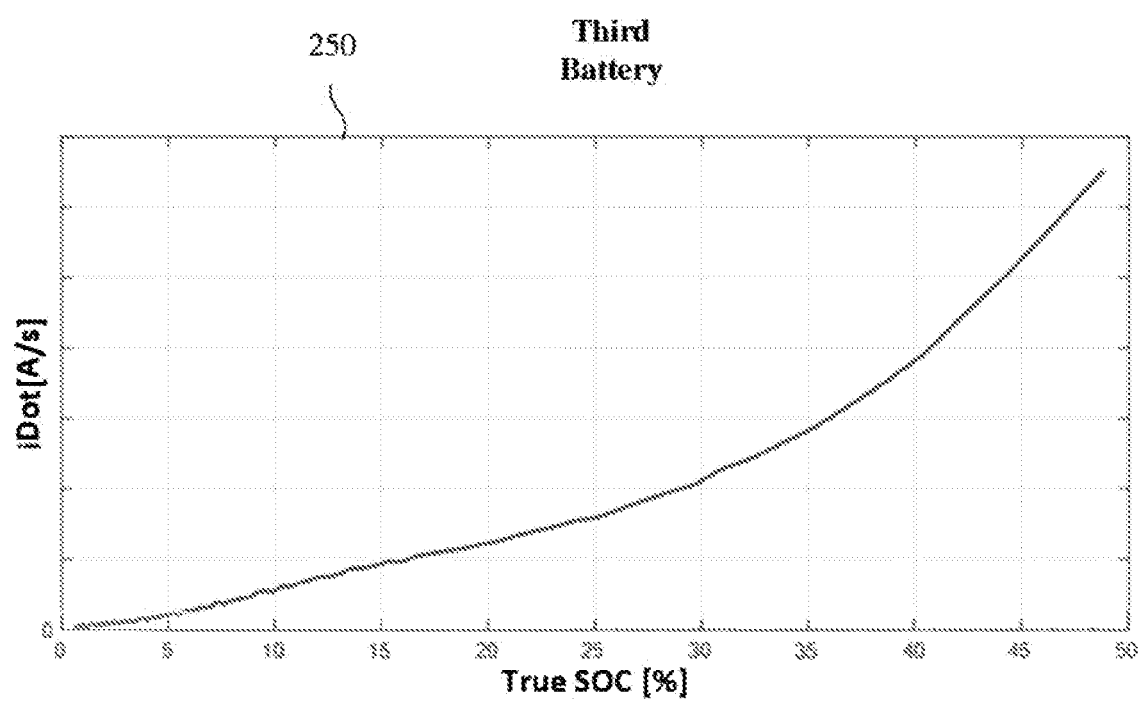
FIG. 3 illustrates a chart showing a plot of rate of change of discharging current supplied by a battery during a discharging operation relative to a measure of true SOC according to an embodiment.

FIG. 3 illustrates a chart 250 showing a plot of rate of change of discharging current supplied by a battery during a discharging operation relative to a true SOC according to an embodiment. A profile for a constant voltage discharge such as shown in chart 250 for a battery may be utilized to indicate an SOC for the battery during a constant voltage discharge operation at a relatively low SOC at a particular iDot as measured in A/s. Although chart 250 shows SOC values between 0 and 50%, it should be appreciated that in some embodiments, a low SOC may comprise an SOC below a threshold value of approximately 20%, such as within a range of SOC of approximately 0-20%, for example. In other words, at a relatively low SOC value a discharge current at constant voltage discharge may exhibit a particular relationship between a rate of discharge of the current and the SOC of the battery such that if the rate of change of the discharge current is measured, it may be utilized to determine a corresponding SOC for the battery, such as via reference to a lookup table of values, for example. In such an embodiment, the SOC determined based on the rate of charge of discharge current may be utilized to replace a value of SOC determined via a coulomb-counting method, for example. The iDot scale may comprise a liner scale of iDot value. Although no units are illustrated on the iDot scale shown in FIG. 3, it should be appreciated that the values of iDot may differ for different battery chemistries, although the scale of chart 250 may be similar across the different battery chemistries.

Figure 4:
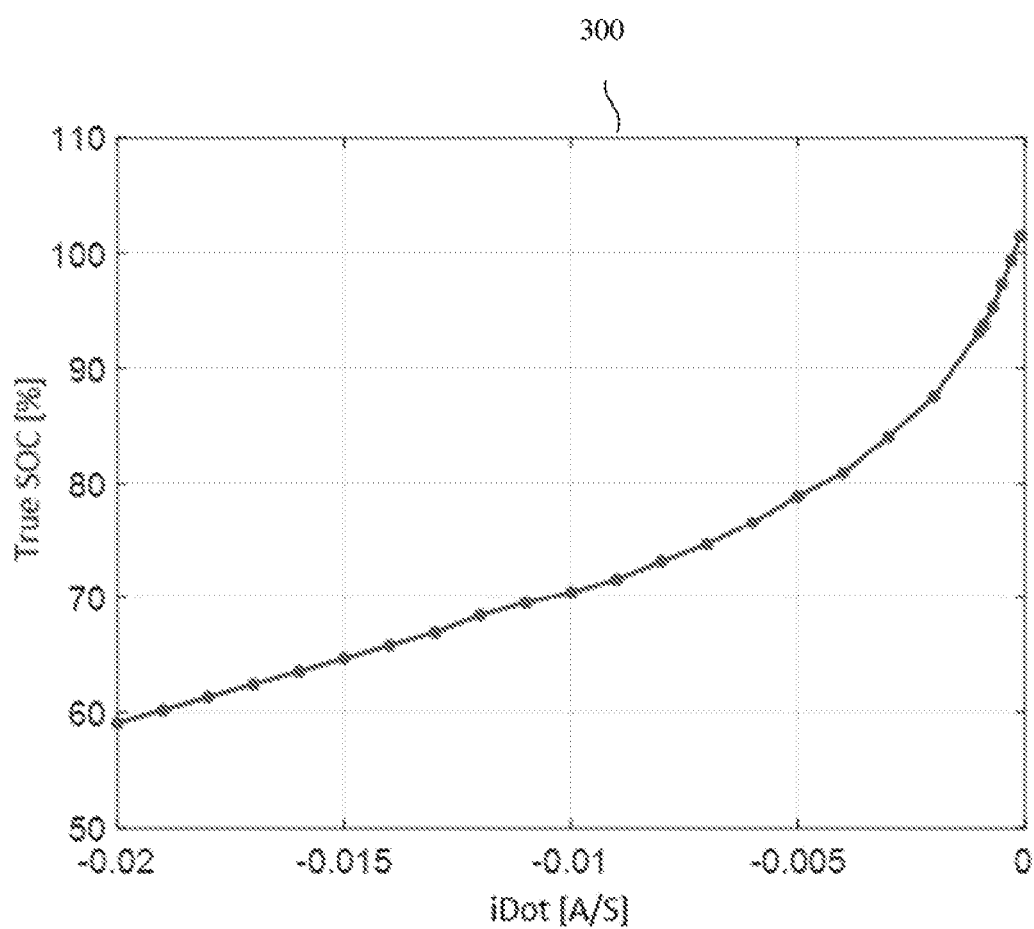
FIG. 4 illustrates a chart showing an embodiment of a rate-of-current versus State of Charge (SOC) profile for a battery.

FIG. 4 illustrates a chart showing an embodiment 300 of a charging current profile for a battery. As shown, embodiment 300 illustrates a plot of true SOC (%) versus iDot (A/s). The chart shown in embodiment 300 is similar to charts shown in FIGS. 2A and 2B, except that the true SOC is shown on the vertical axis instead of on the horizontal axis and iDot is shown on the horizontal axis instead of on the vertical axis.

Table A, as set forth below, is a lookup table indicating a mapping or relationship between iDot and a true SOC for a particular battery at a particular ambient temperature. In accordance with an embodiment, if a rate of change of charging current is measured for a battery being charged, the rate of change of the charging current may be utilized to determine a true SOC for the battery via reference to Table A. Table A illustrates a mapping of iDot values between −0.019 and −0.001 A/s. In this embodiment, the true SOC varies from 60.0% at an iDot of −0.019 A/s to 100% at an iDot of −0.001 A/s. A charging operation performed at different ambient temperatures may be associated with different lookup tables, for example. For example, a first lookup table may be utilized if charging at an ambient temperature of 70° F. or within a certain ambient temperature range, such as 70°-75° F. Similarly, a second lookup table may be utilized if charging at an ambient temperature of 100° F. or within a certain ambient temperature range, such as 100°-105° F., for example.

TABLE A

| SOC vs. iDot Lookup Table for a Battery | |
|---|---|
| iDot [A/s] | SOC [%] |
| −.019 | 60.0% |
| −.018 | 61.1% |
| −.017 | 62.2% |
| −.016 | 63.4% |
| −.015 | 64.6% |
| −.014 | 65.8% |

TABLE A-continued

SOC vs. iDot Lookup Table for a Battery

| iDot [A/s] | SOC [%] |
|---|---|
| −.013 | 67.0% |
| −.012 | 68.0% |
| −.011 | 69.1% |
| −.010 | 70.2% |
| −.009 | 72.1% |
| −.008 | 73.5% |
| −.007 | 75.2% |
| −.006 | 77.8% |
| −.005 | 80.2% |
| −.004 | 84.1% |
| −.003 | 88.7% |
| −.002 | 93.3% |
| −.001 | 100.0% |

Figure 5:
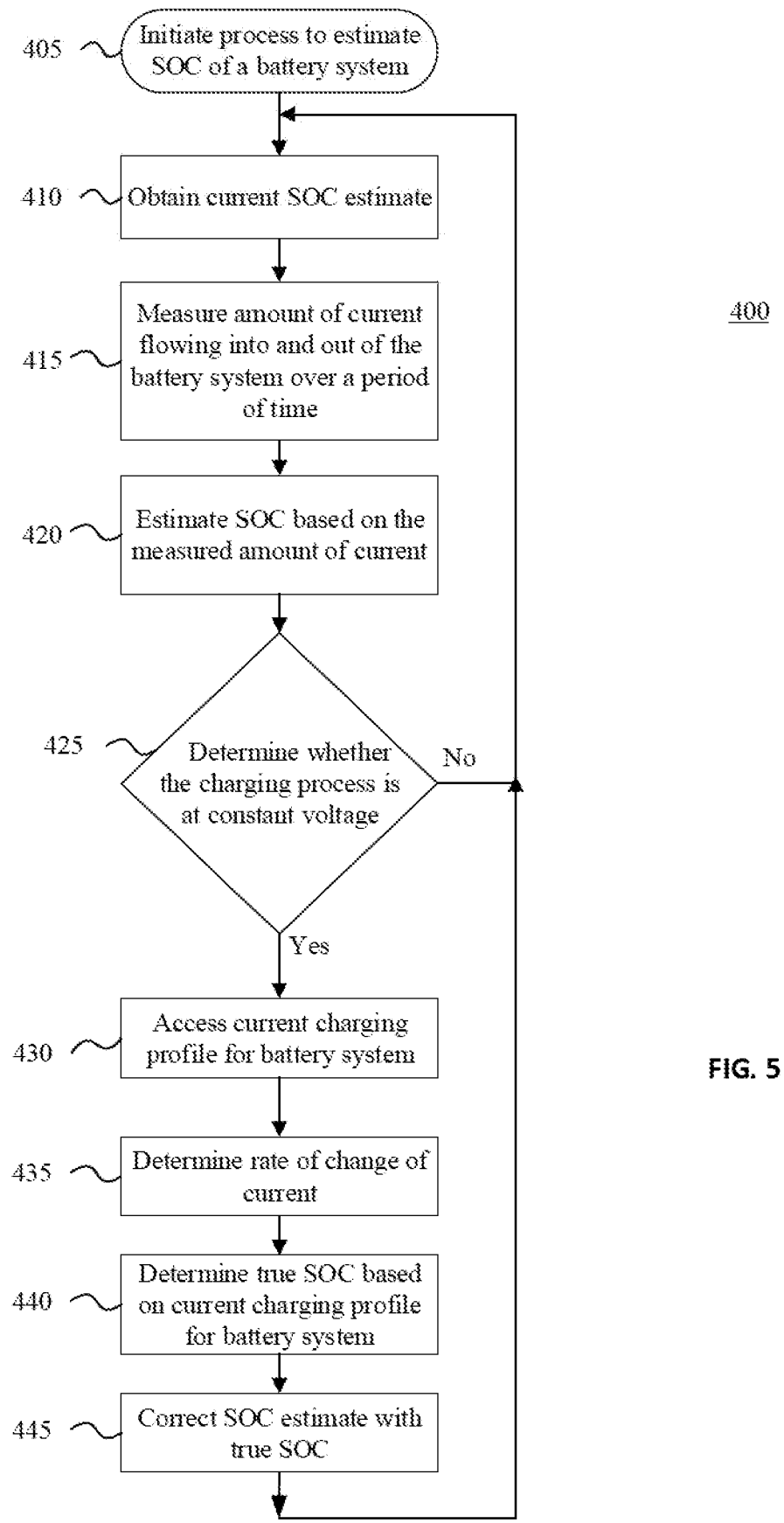
FIG. 5 is an embodiment of a flowchart for determining an SOC of a battery system according to an embodiment.

FIG. 5 is an embodiment 400 of a flowchart for determining an SOC of a battery system comprising one or more batteries according to an embodiment. Embodiments in accordance with claimed subject matter may include all of, less than, or more than blocks 405 through 445. Also, the order of blocks 405 through 445 is merely an example order. A method in accordance with embodiment 400 may be performed in a manner which is in situ, continuous, nonintrusive and/or online, for example. Accordingly, such a method may be performed while a battery performs a typical charging operation, for example.

First, at operation 405, a process to estimate an SOC of a battery system may be initiated. At operation 410, a current SOC estimate may be obtained. For example, the current SOC estimate may comprise the most recently determined SOC estimate for the battery system. Next, at operation 415, an amount of current flowing into and out of the battery system for a period of time may be measured. For example, the period of time may comprise a particular interval of time, such as ten or fifteen minutes in accordance with an embodiment. At operation 420, an SOC estimate be determined or updated based, at least in part, on a measured amount of current flowing into or out of the battery system for the period of time. For example, the amount of current flowing into or out of the battery system may be integrated over the period of time to estimate a change in the SOC of the battery system, such as via a coulomb counting method. At operation 425, a determination may be made as to whether a charging process is being performed at a constant charging voltage level. For example, the constant charging voltage level may comprise a predetermined voltage level known to be the maximum amount of voltage which may be supplied to the battery system during a charging process in accordance with an embodiment. If "no," at operation 425, processing returns to operation 415. If "yes," on the other hand at operation 425, processing proceeds to operation 430 a current charging profile for the battery system may be accessed. At operation 435, a rate of change of the charging current may be determined. Filtering techniques, such as application of a Kalman filter, and/or measurement averaging, such as across a selected range of charge cycles, may be applied to reduce sensor and/or process-related noise from measurements of rate of change of current. For example, in order to get an improved signal-to-noise ratio of a sensor measurement of charging current, such as in order to estimate or determine a value of iDot, filtering techniques may be applied. Use of such filtering techniques may therefore reduce and/or eliminate issues with data noise and/or disturbances which may adversely impact an accuracy of a method for determining an SOC of a battery.

At operation 440, a measurement of a "true" SOC may be determined based, at least in part, on the current charging profile for the battery system, such as is discussed above with respect to FIGS. 2A-B and 4, for example. At operation 445, the SOC estimate may be corrected or replaced with the determined true SOC. Accordingly, an SOC estimate which has drifted from a true or actual SOC value of the battery as a result of accumulation of errors, for example, may be corrected by replacing a current estimate of the SOC with the potentially more accurate true SOC value. Processing may subsequently return to operation 410, for example.

In accordance with an embodiment, an SOC correction window may be utilized to correct or replace an estimate of SOC, such as determined via Coulomb-counting, with a true value of SOC, such as is discussed above with respect to FIG. 5. For example, a correction to a Coulomb-counted estimate of SOC may be performed at one particular instance during a constant-voltage charging mode during a charging operation instead of being performed continuously. Similarly, a correction to a Coulomb-counted estimate of SOC may be performed during one particular instance or during a constant-voltage discharging mode during a discharging operation. It may be sufficient perform this replacement or correction of an estimate SOC with a true SOC value at a single instance during a given charging cycle, for example. For example, if during a charging cycle in an actual application in the field a value of iDot is determined to be −0.01 A/s, then referring to the chart shown in embodiment 300 of FIG. 4, the true or corrected value of SOC may be determined to be 70%. Accordingly, in accordance with an embodiment, it may be sufficient to perform this replacement or correction to a Coulomb-counted SOC based on that one instance instead of being performed continuously throughout the charging cycle.

Figure 6:
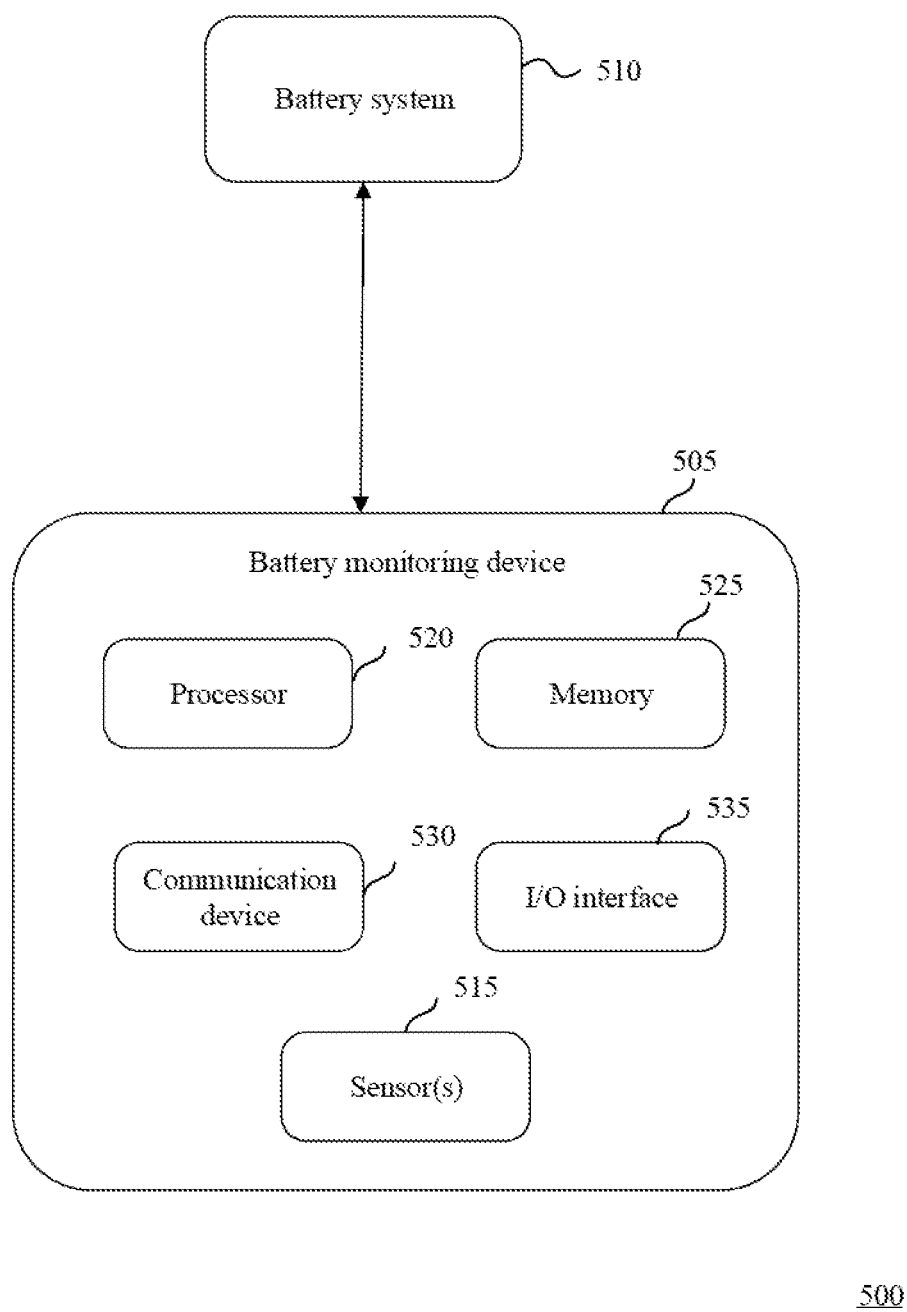
FIG. 6 illustrates an embodiment of a battery monitoring device to determine an SOC estimate for a battery system.

FIG. 6 illustrates an embodiment 500 of a battery monitoring device 505 to determine an SOC estimate for a battery system 510. Battery system 510 may comprise one or more batteries, where each of the one or more batteries comprises one or more cells, for example. Battery monitoring device 505 may include various components, for example, such as one or more sensor(s) 515, a processor 520, a memory 525, a communication device 530, and an Input/Output (I/O) interface 535. Sensor(s) 515 may comprise one or more sensors in communication with battery system 510 to monitor and/or measure an amount of current flowing into and/or out of battery system 510 over a period of time, for example. Processor 520 may obtain a measurement of current flowing into and/or out of battery system 510 and may determine a rate of change of the current, for example. Memory 525 may store one or more charging current profiles for the battery system 510 which map a rate of change of charging current relative to an SOC, such as discussed above with respect to FIGS. 2A-B and 3. Processor 520 may determine an SOC for the battery system 510 based on a determination of the rate of change of the charging current for charging the battery system 510 and via reference to a charging current profile for the battery system 510 as stored in memory 525. Processor 520 may maintain an ongoing SOC estimate based, at least in part, on a Coulomb-counting method or process and may update the SOC estimate with the SOC estimate if the SOC estimate is above a predefined threshold value, such as via reference to the current charging profile for the battery system 510, for example. Communication device 530 may transmit a message such as via a network, for example, to indicate an SOC estimate for the battery system 510, such as by transmitting the message via I/O interface 535.

As will be appreciated based on the foregoing specification, the above-described examples of the disclosure may be implemented using computer programming or engineering techniques including computer software, firmware, hardware or any combination or subset thereof. Any such resulting program, having computer-readable code, may be embodied or provided within one or more non-transitory computer readable media, thereby making a computer program product, i.e., an article of manufacture, according to the discussed examples of the disclosure. For example, the non-transitory computer-readable media may be, but is not limited to, a fixed drive, diskette, optical disk, magnetic tape, flash memory, semiconductor memory such as read-only memory (ROM), and/or any transmitting/receiving medium such as the Internet, cloud storage, the internet of things, or other communication network or link. The article of manufacture containing the computer code may be made and/or used by executing the code directly from one medium, by copying the code from one medium to another medium, or by transmitting the code over a network.

The computer programs (also referred to as programs, software, software applications, "apps", or code) may include machine instructions for a programmable processor and may be implemented in a high-level procedural and/or object-oriented programming language, and/or in assembly/machine language. As used herein, the terms "machine-readable medium" and "computer-readable medium" refer to any computer program product, apparatus, cloud storage, internet of things, and/or device (e.g., magnetic discs, optical disks, memory, programmable logic devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal that may be used to provide machine instructions and/or any other kind of data to a programmable processor.

The above descriptions and illustrations of processes herein should not be considered to imply a fixed order for performing the process steps. Rather, the process steps may be performed in any order that is practicable, including simultaneous performance of at least some steps. Although the disclosure has been described in connection with specific examples, it should be understood that various changes, substitutions, and alterations apparent to those skilled in the art can be made to the disclosed embodiments without departing from the spirit and scope of the disclosure as set forth in the appended claims.

Some portions of the detailed description are presented herein in terms of algorithms or symbolic representations of operations on binary digital signals stored within a memory of a specific apparatus or special purpose computing device or platform. In the context of this particular specification, the term specific apparatus or the like includes a general-purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and generally, considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated.

It has proven convenient at times, principally for reasons of common usage, to refer to such signals as bits, data, values, elements, symbols, characters, terms, numbers, numerals or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

It should be understood that for ease of description, a network device (also referred to as a networking device) may be embodied and/or described in terms of a computing device. However, it should further be understood that this description should in no way be construed that claimed subject matter is limited to one embodiment, such as a computing device and/or a network device, and, instead, may be embodied as a variety of devices or combinations thereof, including, for example, one or more illustrative examples.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

A network may also include now known, and/or to be later developed arrangements, derivatives, and/or improvements, including, for example, past, present and/or future mass storage, such as network attached storage (NAS), a storage area network (SAN), and/or other forms of computing and/or device readable media, for example. A network may include a portion of the Internet, one or more local area networks (LANs), one or more wide area networks (WANs), wire-line type connections, wireless type connections, other connections, or any combination thereof. Thus, a network may be worldwide in scope and/or extent. Likewise, sub-networks, such as may employ differing architectures and/or may be substantially compliant and/or substantially compatible with differing protocols, such as computing and/or communication protocols (e.g., network protocols), may interoperate within a larger network. In this context, the term sub-network and/or similar terms, if used, for example, with respect to a network, refers to the network and/or a part thereof. Sub-networks may also comprise links, such as physical links, connecting and/or coupling nodes, such as to be capable to transmit signal packets and/or frames between devices of particular nodes, including wired links, wireless links, or combinations thereof. Various types of devices, such as network devices and/or computing devices, may be made available so that device interoperability is enabled and/or, in at least some instances, may be transparent to the devices. In this context, the term transparent refers to devices, such as network devices and/or computing devices, communicating via a network in which the devices are able to communicate via intermediate devices of a node, but without the communicating devices necessarily specifying one or more intermediate devices of one or more nodes and/or may include communicating as if intermediate devices of intermediate nodes are not necessarily involved in communication transmissions. For example, a router may provide a link and/or connection between otherwise separate and/or independent LANs. In this context, a private network refers to a particular, limited set of network devices able to communicate with other network devices in the particular, limited set, such as via signal packet and/or frame transmissions, for example, without a need for re-routing and/or redirecting transmissions. A private network may comprise a stand-alone network; however, a private network may also comprise a subset of a larger network, such as, for example, without limitation, all or a portion of the Internet. Thus, for example, a private network "in the cloud" may refer to a private network that comprises a subset of the Internet, for example. Although signal packet and/or frame transmissions may employ intermediate devices of intermediate nodes to exchange signal packet and/or frame transmissions, those intermediate devices may not necessarily be included in the private network by not being a source or destination for one or more signal packet and/or frame transmissions, for example. It is understood in this context that a private network may provide outgoing network communications to devices not in the private network, but devices outside the private network may not necessarily be able to direct inbound network communications to devices included in the private network.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all implementations falling within the scope of the appended claims, and equivalents thereof

What is claimed is:

1. A method, comprising:
  estimating a first state of charge (SOC) measurement for a battery based, at least in part, on a measurement of current supplied to the battery and/or withdrawn from the battery during a first period of time;
  estimating a rate of change of the current supplied to the battery at a particular constant voltage value during a portion of a first charging operation;
  accessing a predefined charging current profile for the battery indicating a mapping between measurements of rates of change of current supplied to the battery at the particular constant voltage value and true SOC measurements for the battery;
  determining a true SOC measurement for the battery at a particular point in time during the portion of the first charging operation based, at least in part, on the mapping of the measurements of the rates of change of current supplied to the battery and the true SOC measurements; and
  correcting the first SOC measurement to match the true SOC measurement at the particular point in time.

2. The method of claim 1, wherein estimating the first SOC measurement is performed via Coulomb-counting.

3. The method of claim 1, wherein the profile for the battery is based, at least in part, on a particular battery chemistry of the battery.

4. The method of claim 3, wherein the profile for the battery is further based, at least in part, on a particular constant voltage charge protocol at a particular temperature range and state of health (SOH) range of the battery during the first charging operation.

5. The method of claim 1, wherein the battery comprises a lithium ion battery chemistry.

6. The method of claim 1, wherein the rate of current supplied to the battery is variable at the particular constant voltage value during the portion of the first charging operation based, at least in part, on the true SOC of the battery.

7. The method of claim 1, wherein the estimation of the first SOC measurement is performed continuously.

8. The method of claim 1, wherein the determination of the true SOC measurement is performed at least once during a particular charging cycle.

9. A system, comprising:
  a memory to store a state of charge (SOC) profile for a battery indicating a mapping between measurements of rates of change of current supplied to the battery at the particular constant voltage value and SOC measurements for the battery;
  a processor to:
    estimate a first SOC measurement for the battery based, at least in part, on a measurement of current supplied to the battery during a first period of time;
    estimate a rate of change of the current supplied to the battery at a particular constant voltage value during a portion of a first charging operation during the first period of time;
    determine a true SOC measurement for the battery at a particular point in time during the portion of the first charging operation based, at least in part, on the mapping of the measurements of the rates of charge supplied to the battery and the true SOC measurements; and
    correct the first SOC measurement to match the true SOC measurement at the particular point in time.

10. The system of claim 9, wherein the processor estimates the first SOC measurement via Coulomb-counting.

11. The system of claim 9, wherein the profile for the battery is based, at least in part, on a particular battery chemistry of the battery.

12. The system of claim 11, wherein the profile for the battery is further based, at least in part, on a particular constant voltage charge protocol at a particular temperature range and state of health (SOH) range of the battery during the first charging operation.

13. The system of claim 9, wherein the rate of current supplied to the battery is variable at the particular constant voltage value during the portion of the first charging operation based, at least in part, on the true SOC of the battery.

14. The system of claim 9, wherein the processor continuously estimates the first SOC measurement.

15. An article, comprising:
 a non-transitory storage medium comprising machine-readable instructions executable by one or more processors to:
 estimate a first state of charge (SOC) measurement for a battery based, at least in part, on a measurement of current supplied to battery and/or withdrawn from the battery during a first period of time;
 estimate a rate of change of the current supplied to the battery at a particular constant voltage value during a portion of a first charging operation during the first period of time;
 access a current charging profile for the battery indicating a mapping between measurements of rates of change of current supplied to the battery at the particular constant voltage value and true SOC measurements for the battery;
 determine a true SOC measurement for the battery at a particular point in time during the portion of the first charging operation based, at least in part, on the mapping of the measurements of the rates of charge supplied to the battery and the true SOC measurements; and
 correct the first SOC measurement to match the true SOC measurement at the particular point in time.

16. The article of claim 15, wherein the machine-readable instructions are further executable to estimate the first SOC measurement via a Coulomb-counting.

17. The article of claim 15, wherein the profile for the battery is based, at least in part, on a particular battery chemistry of the battery.

18. The article of claim 17, wherein the profile for the battery is further based, at least in part, on a particular constant voltage charge protocol at a particular temperature range and state of health (SOH) range of the battery during the first charging operation.

19. The article of claim 15, wherein the battery comprises a lithium ion battery chemistry.

20. The article of claim 15, wherein the rate of current supplied to the battery is variable at the particular constant voltage value during the portion of the first charging operation based, at least in part, on the true SOC of the battery.

* * * * *